US010615100B2

(12) United States Patent
Fukuoka

(10) Patent No.: US 10,615,100 B2
(45) Date of Patent: Apr. 7, 2020

(54) ELECTRONICS ASSEMBLIES AND COOLING STRUCTURES HAVING METALIZED EXTERIOR SURFACE

(71) Applicant: Toyota Motor Engineering & Manufacturing North America, Inc., Erlanger, KY (US)

(72) Inventor: Yuji Fukuoka, Northville, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 15/423,086

(22) Filed: Feb. 2, 2017

(65) Prior Publication Data

US 2018/0166359 A1    Jun. 14, 2018

Related U.S. Application Data

(60) Provisional application No. 62/431,654, filed on Dec. 8, 2016.

(51) Int. Cl.
*H01L 23/473* (2006.01)
*H01L 23/00* (2006.01)
(Continued)

(52) U.S. Cl.
CPC .......... *H01L 23/473* (2013.01); *H01L 23/367* (2013.01); *H01L 23/3738* (2013.01); *H01L 24/32* (2013.01); *H01L 2224/32221* (2013.01); *H01L 2224/48091* (2013.01); *H01L 2224/48106* (2013.01); *H01L 2224/48221* (2013.01);
(Continued)

(58) Field of Classification Search
CPC ....... H01L 21/4882; H01L 23/36–4735; H01L 31/024; H01L 31/052–0525; H01L 33/64–648; H01L 45/1286; H01L 51/529; H01L 2933/0075; H01L 2023/4018–4087
See application file for complete search history.

(56) References Cited

U.S. PATENT DOCUMENTS 7,916,480 B2    3/2011 Woody et al.
8,012,808 B2    9/2011 Shi et al.
(Continued)

FOREIGN PATENT DOCUMENTS

WO    2015086184 A1    6/2015

*Primary Examiner* — Cuong B Nguyen
(74) *Attorney, Agent, or Firm* — Dinsmore & Shohl LLP

(57) ABSTRACT

An electronics assembly comprises a semiconductor device having a first device surface and at least one device conductive layer disposed on the first device surface. A cooling structure is coupled to the semiconductor device. The cooling structure comprises a first cooling structure surface and a second cooling structure surface. The second cooling structure surface is opposite from the first cooling structure surface and the first cooling structure surface is coupled to the semiconductor device. One side cooling structure surface is transverse to the respective first and second cooling structure surface. The one side electrode is disposed on the at least one side cooling structure surface in which the at least one side electrode is electrically coupled to the at least one device conductive layer. The cooling structure includes a fluid inlet for receiving a cooling fluid and a fluid outlet for removing the cooling fluid from the cooling structure.

14 Claims, 4 Drawing Sheets

(51) Int. Cl.
*H01L 23/373* (2006.01)
*H01L 23/367* (2006.01)

(52) U.S. Cl.
CPC .............. *H01L 2224/73265* (2013.01); *H01L 2924/1033* (2013.01); *H01L 2924/10155* (2013.01); *H01L 2924/10254* (2013.01); *H01L 2924/10272* (2013.01); *H01L 2924/10323* (2013.01); *H01L 2924/10325* (2013.01)

(56) References Cited

U.S. PATENT DOCUMENTS

| | | |
|---|---|---|
| 8,546,930 B2 | 10/2013 | Bakir et al. |
| 9,220,184 B2 | 12/2015 | Ranjan et al. |
| 9,355,933 B2 | 5/2016 | Ching et al. |
| 9,484,284 B1 * | 11/2016 | Gambin .............. H01L 23/4735 |
| 2005/0211417 A1 * | 9/2005 | Upadhya .............. F04B 19/006 165/80.4 |
| 2007/0063337 A1 * | 3/2007 | Schubert .............. H01L 23/473 257/714 |
| 2007/0126103 A1 * | 6/2007 | Shi ...................... H01L 21/6835 257/686 |
| 2007/0256810 A1 * | 11/2007 | Di Stefano ........... H01L 23/473 165/46 |
| 2014/0190665 A1 | 7/2014 | Joshi et al. |
| 2014/0290916 A1 | 10/2014 | Arik et al. |
| 2017/0133298 A1 * | 5/2017 | Gutala ................... G01K 7/343 |

* cited by examiner

ELECTRONICS ASSEMBLIES AND COOLING STRUCTURES HAVING METALIZED EXTERIOR SURFACE

CROSS-REFERENCE TO RELATED APPLICATIONS

This application claims the benefit of U.S. Provisional Patent Application No. 62/431,654, filed on Dec. 8, 2016, hereby incorporated in its entirety.

TECHNICAL FIELD

The present specification generally relates to power electronics assemblies, and more particularly, to power electronics assemblies having a semiconductor device and a cooling structure with a metalized exterior surface and an integrated fluid channel system extending within the semiconductor device and/or cooling structure.

BACKGROUND

Heat sinking devices may be coupled to a heat generating device, such as a power electronics device, to remove heat and lower the maximum operating temperature of the heat generating device. Cooling fluid may be used to receive heat generated by the heat generating device by convective thermal transfer, and remove such heat from the heat generating device. For example, a jet of cooling fluid may be directed such that it impinges a surface of the heat generating device. Another way to remove heat from a heat generating device is to couple the device to a finned heat sink made of a thermally conductive material, such as aluminum.

However, as power electronics are designed to operate at increased power levels and generate increased corresponding heat flux due to the demands of newly developed electrical systems, conventional heat sinks are unable to adequately remove the heat flux to effectively lower the operating temperature of the power electronics to acceptable temperature levels. Further, conventional heat sinks and cooling structures require additional bonding layers and thermal matching materials (e.g., bond layers, substrates, thermal interface materials). These additional layers add substantial thermal resistance to the overall assembly and make thermal management of the electronics system challenging. Moreover, semiconductor devices may have high on-resistance which generates more heat and reduces the performance of the devices.

Accordingly, a need exists for alternative power electronics assemblies and power electronics devices using a metallization of at least a portion of an exterior surface of a cooling structure to provide one or more electrical current flowpaths and enhance the performance of the devices.

SUMMARY

In one embodiment, an electronics assembly includes a semiconductor device having a first device surface and at least one device conductive layer disposed on the first device surface. A cooling structure is coupled to the semiconductor device. The cooling structure includes a first cooling structure surface and a second cooling structure surface wherein the second cooling structure surface is opposite from the first cooling structure surface. The cooling structure further includes at least one side cooling structure surface that is transverse to the respective first and second cooling structure surface, and at least one side electrode that is disposed on the at least one side cooling structure surface in which the at least one side electrode is electrically coupled to the at least one device conductive layer. The cooling structure further includes a fluid inlet for receiving a cooling fluid and a fluid outlet for removing the cooling fluid from the cooling structure.

In another embodiment, an electronics assembly includes a semiconductor device having a first device surface and a second device surface opposite from the first device surface. At least one device conductive layer is disposed on the first device surface. The semiconductor device further includes at least one semiconductor fluid channel at the first device surface that has an inner surface having a first wall portion and a second wall portion spaced apart from the first wall portion by a channel width. The at least one device conductive layer is disposed on the inner surface of the at least one semiconductor fluid channel. The electronic assembly further includes a cooling structure that is coupled to the semiconductor device. The cooling structure includes a first cooling structure surface and a second cooling structure surface opposite from the first cooling structure surface. At least one side cooling structure surface is transverse to the first cooling structure surface and the second cooling structure surface. At least one side electrode is disposed on the at least one side cooling structure surface. The at least one side electrode is electrically coupled to the at least one device conductive layer. At least one metalized through-substrate via is configured to extend through the cooling structure. A fluid inlet for receiving a cooling fluid and a fluid outlet for removing the cooling fluid from the cooling structure and at least one microchannel is fluidly coupled to the fluid inlet, the fluid outlet and the at least one semiconductor fluid channel.

In yet another embodiment, an electronics assembly includes a semiconductor device having a first device surface and at least one device conductive layer that is disposed on the first device surface. The electronic assembly further includes a cooling structure coupled to the semiconductor device. The cooling structure includes a manifold layer having a fluid inlet and a fluid outlet. The manifold layer defines a first cooling structure surface and a microchannel layer bonded to the manifold layer. The microchannel layer includes at least one microchannel fluidly coupled to the fluid inlet and the fluid outlet. The microchannel layer defines a second cooling structure surface opposite from the first cooling structure surface. At least one side cooling structure surface of the cooling structure is transverse to the first cooling structure surface and the second cooling structure surface. One or more cooling structure conductive layers are disposed on the first cooling structure surface, the second cooling structure surface, and the at least one side cooling structure surface.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
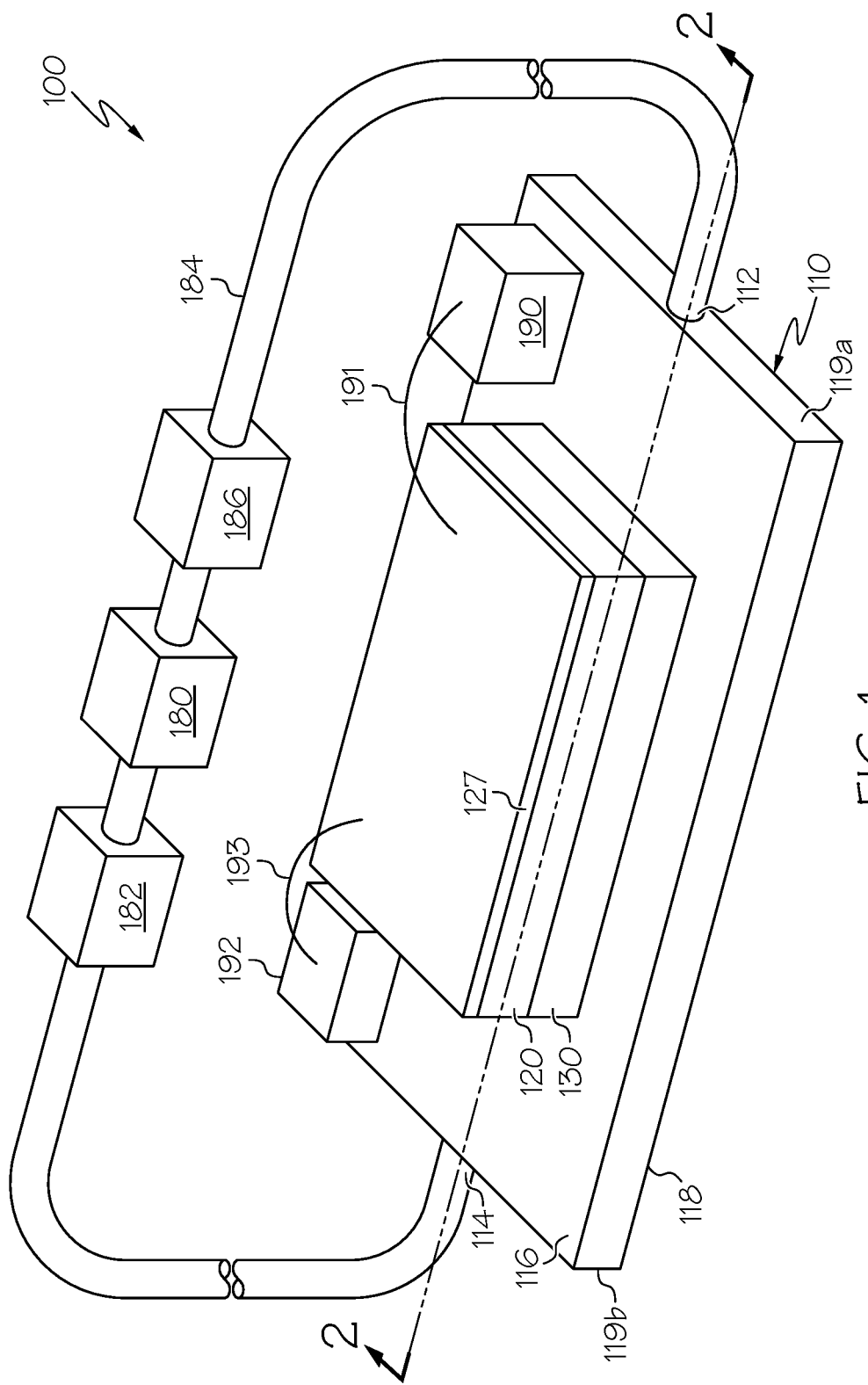
FIG. 1 schematically depicts a top perspective view of an example power electronics assembly having a semiconductor device and a cooling structure, according to one or more embodiments shown and described herein.

Referring generally to the figures, embodiments of the present disclosure are directed to a power electronics assembly that incorporates electrical connectivity into cooling structures such as cooling chips and/or manifolds of a semiconductor device incorporating microchannels. An example electronics assembly includes a semiconductor device, a cooling structure, and electrically conductive layers on both the semiconductor device and the cooling structure. The cooling structure includes various inlet and outlet channels to introduce and remove coolant fluid from microchannels within the semiconductor device that are fluidly coupled to the cooling structure. The microchannels of the semiconductor device are metalized with one or more electrically conductive layers such that they are electrically conductive. The fluid channel metallization layer lower the electrical on-resistance on the semiconductor device, maintaining or even improving the electrical performance of the semiconductor device while simultaneously improving heat removal from the semiconductor device. The cooling structure includes inlet and outlet fluid channels that are metalized through substrate via (TSV) that provide electrical interconnection between an electrically conductive layer on the cooling structure and the electrically conductive microchannels. In some embodiments, integrated microchannels in the semiconductor device itself are electrically coupled to integrated TSVs in the cooling structure. Furthermore, the cooling structure includes side electrodes that provide an additional electrically conductive path between the electrically conductive layer on the bottom of the cooling structure and the top of the cooling structure. Accordingly, the top, bottom and sides of the cooling structure may be covered (e.g., plated) with an electrically conductive material.

In an alternative embodiment, an example electronics assembly includes a semiconductor device, an alternative cooling structure, a solder layer, and electrically conductive layers on both the semiconductor device and the cooling structure. The cooling structure is defined by a manifold layer and a microchannel layer bonded to the manifold layer. The semiconductor device is coupled to the cooling structure by the solder layer. The solder layer is electrically conductive and provides a thermal interface between the semiconductor device and the cooling structure. Moreover, the semiconductor device is disposed between electrically conductive layers. The manifold layer includes inlet and outlet fluid channels that are fluidly coupled to microchannels of the microchannel layer. Coolant fluid flows through the inlet channel, the microchannels, and the outlet channel to cool the semiconductor device during operation.

Exterior surfaces of the cooling structure may be plated with metal to provide an electrical path for electrical current around a perimeter of the cooling structure. A cooling structure having plated metal on the exterior surface thereof provides a larger surface area for electrical current, thereby lowering the resistance of the electronics assembly. The top surface of the cooling structure is electrically coupled to the electrically conductive layer of the semiconductive device.

Figure 2:
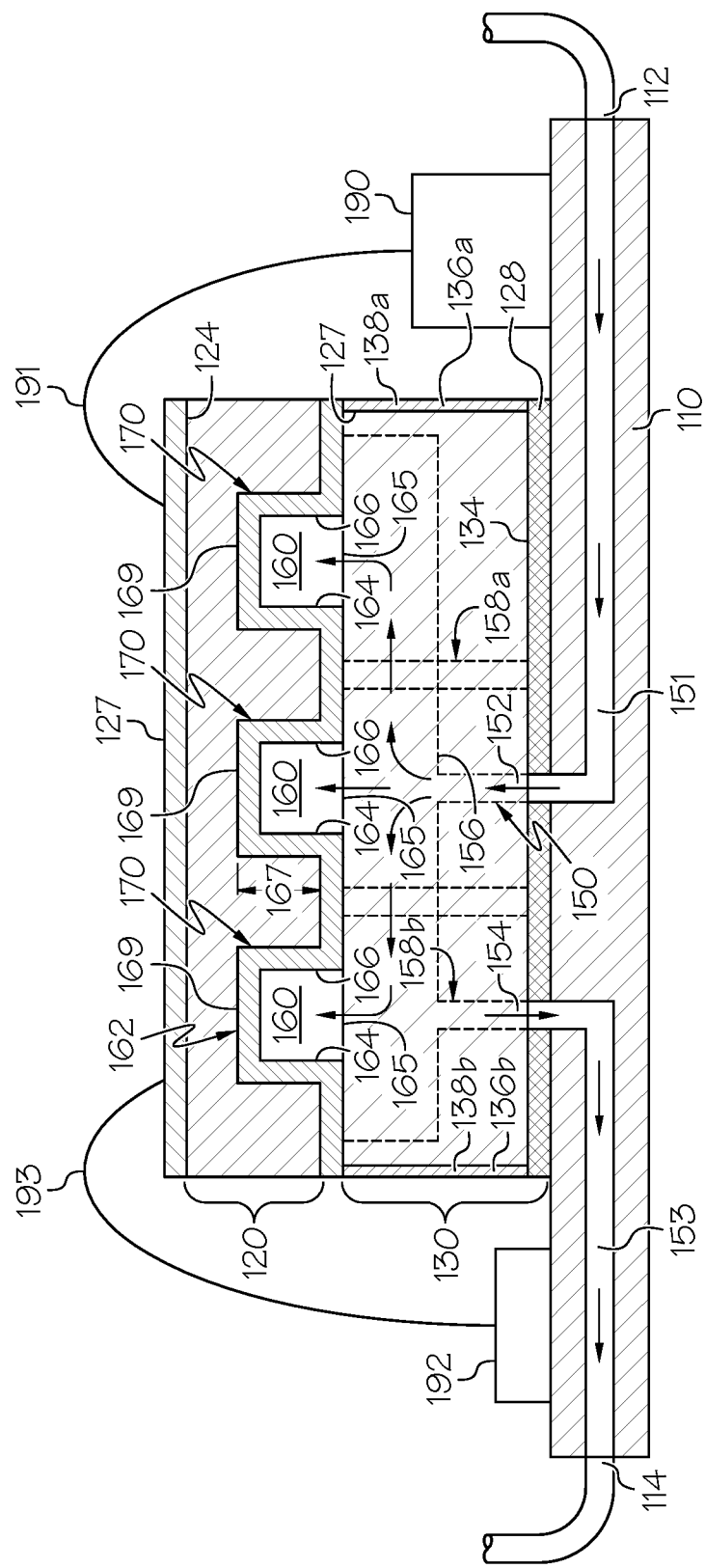
FIG. 2 schematically depicts a cross section of the example power electronics assembly of FIG. 1 having an example of side electrodes on sides of the cooling structure and an example integrated fluid channel system extending into a semiconductor device, according to one or more embodiments shown and described herein.

Referring to FIGS. 1 and 2, an example power electronics assembly 100 comprising a semiconductor device 120 and a cooling structure 130 coupled to a substrate layer 110 is schematically depicted. Specifically, FIG. 2 depicts a cross-sectional view of embodiment of the power electronics assembly 100 along line A-A of FIG. 1. The semiconductor device 120 includes a first device surface 122 and second device surface 124. In one embodiment, at least one device conductive layer 126 is disposed on the first device surface 122. Alternatively, both of the first device surface 122 and the second device surface 124 may be covered by the first device conductive layer 126 and the second device conductive layer 127, respectively. The semiconductor device 120 is configured to have a vertical electrical current pathway extending through the semiconductor device 120 between the first device surface 122 and the second device surface 124. The semiconductor device 120 comprises a semiconductor material, such as, without limitation Si, GaAs, SiC, GaN, AN, BN, diamond, or the like. As a non-limiting example, the semiconductor material may be a wide bandgap semiconductor material, for example, any semiconductor material comprising a bandgap of about 3 eV or more. Example wide bandgap semiconductor materials include SiC, GaN, AN, BN, and diamond. In some embodiments, the semiconductor device 120 may comprise an insulated-gate bi-polar transistor ("IGBT"), a metal-oxide-semiconductor field-effect transistor ("MOSFET") or any other semiconductor device. Further, as a non-limiting example, the semiconductor device 120 may operate at temperatures between about 150° C. and about 350° C. It should be understood that other operation temperatures are possible. The semiconductor device further comprise at least one semiconductor fluid channel 160 at the first device surface 120.

In the illustrated embodiment, the at least one semiconductor fluid microchannels 160 includes a plurality of the fluid microchannels 160. As an example in FIG. 2, there is shown three fluid microchannels 160, however, any number of microchannels 160 can be used depending on the size and shape of the semiconductor device 120. The at least one semiconductor fluid microchannels 160 includes an inner surface 162 including a first wall portion 164 and a second wall portion 166 spaced apart from the first wall portion 164 by a microchannel width 165. The at least one semiconductor fluid microchannel 160 extends from the first device surface 122 of the semiconductor device 120 to a termination location 169 located within a bulk of the semiconductor device 120. Each of the three semiconductor fluid microchannels 160 includes straight microchannels having a uniform cross sectional shape along the first device surface 120 of the semiconductor device. The semiconductor fluid microchannel 160 may take on any shape or configuration.

The at least one microchannel 160 may be formed within the semiconductor material by an etching process, for example, any method of forming the at least one microchannel may be utilized. The semiconductor device 120 further comprises a fluid microchannel metallization layer 170 positioned along the inner surface 162 of the one or more semiconductor fluid microchannels 160. The fluid microchannel metallization layer 170 may comprise, copper, copper oxide, graphite, brass, silver, platinum, or any other electrical conductive metal or metal oxide. In some embodiments, the fluid channel metallization layer 170 is positioned along the inner surface 162 of the one or more semiconductor fluid channels 160 using a deposition process, for example, electroplating, physical vapor deposition, chemical vapor deposition, laser metal deposition, or any other known or yet to be developed deposition process. Further, the fluid channel metallization layer 170 may comprise a uniform thickness along the inner surface 162. At least one device conductive layer 126 is disposed on the inner surface 162 of the at least one semiconductor fluid microchannel 160. In some embodiments, the fluid channel metallization layer 170 and the least one device conductive layer 126 are formed of the same electrical conductive layer. Non-limiting example power electronics assemblies and integrated fluid channel systems including fluid channel metallization layers are described in U.S. application Ser. No. 15/218,801 titled "Power Electronics Assemblies Having a Semiconductor Device with Metallized Embedded Cooling Channels," filed on Jul. 25, 2016, and U.S. application Ser. No. 15/175,622 titled "Power Electronics Assemblies Having a Semiconductor Cooling Chip and an Integrated Fluid Channel System," filed on Jun. 7, 2016, and U.S. application Ser. No. 15/175,674 titled "Power Electronics Assemblies having a Wide Bandgap Semiconductor Device and an Integrated Fluid Channel System," filed on Jun. 7, 2016, which are hereby incorporated by reference in their entireties.

As depicted specifically in FIG. 2, one or more semiconductor fluid channels 160 are located in the semiconductor device 120 and are positioned in fluid communication with the substrate fluid inlet channel 151 and the substrate fluid outlet channel 153. The one or more semiconductor fluid channels 160 is positioned in the semiconductor device 120, for example, extending into the first device surface 122. The one or more semiconductor fluid channels 160 extend into the semiconductor device 120 from the first device surface 122 to a termination location 169 located within the semiconductor device 120, for example, located within the bulk of the semiconductor device 120. Further, the distance between the termination location 169 and the first device surface 122 is a channel height 167. The channel height 167 may be between about 10 μm and about 500 μm, for example, about 25 μm, 50 μm, 100 μm, 150 μm, 200 μm, 250 μm, 300 μm, 400 μm, or the like. Moreover, the channel height 167 of the one or more semiconductor fluid channels 160 may be variable. As one non-limiting example, the channel height 167 of an individual semiconductor fluid channel 160 may vary along a fluid pathway of the individual semiconductor fluid channel 160. As another non-limiting example, in embodiments comprising multiple semiconductor fluid channels 160, individual semiconductor fluid channels 160 may comprise different channel heights 167. While not depicted in FIG. 2, the one or more semiconductor fluid channels 160 may extend through the semiconductor device 120 from the first device surface 122 to the second device surface 124.

Referring still to FIG. 2, the one or more semiconductor devices 120 may comprise a fluid channel metallization layer 170 positioned along the inner surface 162 of the one or more semiconductor fluid channels 160. The fluid channel metallization layer 170 may comprise, copper, copper oxide, graphite, brass, silver, platinum, or any other metal or metal oxide. Further, the fluid channel metallization layer 170 may comprise a uniform thickness along the inner surface 162, for example, a thickness of between about 0.1 μm and about 10 μm, for example 0.5 μm, 1 μm, 2 μm, 3 μm, 5 μm, 8 μm, or the like. Further, in some embodiments, the thickness of the fluid channel metallization layer 170 may be between about 1 μm and about 3 μm. In some embodiments, the fluid channel metallization layer 170 is positioned along the inner surface 162 of the one or more semiconductor fluid channels 160 using a deposition process, for example, electroplating, physical vapor deposition, chemical vapor deposition, laser metal deposition, or any other known or yet to be developed deposition process.

In operation, the fluid channel metallization layer 170 and the side electrode 138 may reduce the electrical on-resistance of the semiconductor device 120, for example, the electrical on-resistance applied by the semiconductor device 120 to the vertical current pathway extending between the first conductive layer 126 and the second conductive layer 127, for example, extending from the second conductive layer 127 (e.g., source electrode) to the first conductive layer 126 (e.g., drain electrode).

As one non-limiting example, an example semiconductor device 120 comprising one or more semiconductor fluid channels 160 having the fluid channel metallization layer 170 positioned along the inner surface 162 of the one or more semiconductor fluid channels 160 may comprise an electrical on-resistance that is between about 5% and about 50% of the electrical on-resistance of a similar semiconductor device the includes one or more semiconductor fluid channels 160 that does not include the fluid channel metallization layer 170, for example, 10%, 15%, 20%, 25%, 30%, 40%, or the like. By decreasing the electrical on-resistance caused by the one or more semiconductor fluid channels 160, the fluid channel metallization layer 170 may improve electrical performance of the semiconductor device 120. In particular, the fluid channel metallization layer 170 allows the semiconductor device 120 to operate with an electrical on-resistance similar to and in some embodiments, better than the electrical on-resistance of an example semiconductor device without one or more semiconductor fluid channels 160. Thus, in operation, the semiconductor device 120 comprising the one or more semiconductor fluid channels 160 and the fluid channel metallization layer 170 have improved cooling without diminished electrical performance.

Referring still to FIGS. 1 and 2, the cooling structure 130 includes a first cooling structure surface 132 and a second cooling structure surface 134 opposing one another. The cooling structure 130 is coupled to the semiconductor device 120 via the cooling structure surface 132 by any coupling method. At least one side cooling structure surface 136 is transverse to the cooling structure surface 132 and the cooling structure surface 134. In the illustrated embodiment, a third conductive layer 128 is disposed on the second cooling structure surface 134. It is within the scope of the present disclosure that the first conductive layer 126 and third conductive layer 128 cover both the first cooling structure surface 132 and the second cooling structure surface 134. At least one side electrode 138 is disposed on the at least one side cooling structure surface 136a in which the at least one side electrode 138 is electrically coupled to the at least one device conductive layer 126 as will be described in greater detail hereinbelow. In one embodiment, both respective first and second side surfaces 136a, 136b of the cooling structure can be covered by a first side electrode 138a and a second side electrode 138b.

Referring again to FIGS. 1 and 2, the first side electrode 138a and the second side electrode 138b are each thermally coupled to the semiconductor device 120. Further, the first side electrode 138a and the second side electrode 138b are each electrically coupled to the semiconductor device 120 such that an electrical current pathway is formed between the first side electrode 138a and the second side electrode 138b, extending through the semiconductor device 120, for example, a vertical electrical current pathway. The first and second electrodes 138a, 138b may comprise any electrically conductive material such as, without limitation, copper, copper oxide, graphite, brass, silver, platinum, or the like. In some embodiments, the respective first side electrode 138a and the second side electrode 138b may comprise a discrete metal layer that is bonded to the respective side surface 136a and the side surface 136b of the cooling structure 130. In other embodiments, the respective first side electrode 138a and the second side electrode 138b may comprise a metallization layer that is deposited onto the respective side surface 136a and the second side surface 136b using any known or yet to be developed deposition process, for example, electroplating, physical vapor deposition, chemical vapor deposition, laser metal deposition, or any other known or yet to be developed deposition process. In some embodiments, a majority of the exterior surface of the cooling structure 130 can be metallized with a metal layer to provide a side electrode providing an electrical path for electrical current around a perimeter of the cooling structure 130. Alternatively, the entire exterior surface of the cooling structure 130 can be metallized with a metal layer to provide an electrical path for current around a perimeter of the cooling structure 130. In some embodiments, depending on the arrangement of the semiconductor device 120 with respect to the cooling structure 130, the side electrodes 138a, 138b may be a source or drain electrode.

As depicted in FIG. 2, the example electronics assembly 100 includes an integrated fluid channel system 150 extending within the cooling structure 130 and at least a portion of the semiconductor device 120 via the substrate layer 110. The integrated fluid channel system 150 provides a fluid flowpath extending within the cooling structure 130 and the semiconductor device 120 such that a dielectric cooling fluid may be circulated through the substrate layer 110 and cooling structure 130 to remove heat from one or more semiconductor devices 120 of the power electronics assembly 100. Example, non-limiting dielectric cooling fluids include R-245fa and HFE-7100. Other dielectric cooling fluids may be utilized. The type of dielectric cooling fluid chosen may depend on the operating temperature of the heat generating devices to be cooled. The cooling structure 130 includes a fluid inlet 152 for receiving the dielectric cooling fluid and a fluid outlet 154 for removing the dielectric cooling fluid from the cooling structure 130. The coolant fluid from the substrate layer 110 is directed into the cooling structure 130 via the fluid inlet 152 and enters into a manifold channel 156. The manifold channel 156 is fluidly coupled to the least one semiconductor fluid microchannel 160. Cooling fluid flows out of the manifold channels 156 and into the respective semiconductor fluid microchannels 160 such that it is circulated through the semiconductor device 120. After the coolant fluid is circulated to remove heat from the semiconductor 120, the coolant fluid is discharged from the cooling structure via fluid outlet 154. In a non-limiting example, the fluid inlet 152 and the fluid outlet 154 may be formed into the side surfaces 136a, 136b of the cooling structure 130 and direct the flowpath into the pond 156 without using the substrate layer 110.

Referring now to the cross-sectional view of FIG. 2, the integrated fluid channel system 150 comprises a plurality of cooling channels 160 extending between the substrate inlet port 112 and the substrate outlet port 114 of the substrate layer 110. The plurality of cooling channels extend into the substrate layer 110, the third conductive layer 128, the cooling structure 130 and further extend to the bulk of semiconductor device 120. As depicted in FIG. 2, the integrated fluid channel system 150 includes a substrate fluid inlet channel 151 extending from the substrate inlet port 112 into the substrate layer 110 and a substrate fluid outlet channel 153 extending from the substrate outlet port 114 into the substrate layer 110. The substrate fluid inlet channel 151 extends between the substrate inlet port 112 and the third conductive layer 128 of the cooling structure 130. Further, the substrate fluid outlet channel 153 extends between the substrate outlet port 114 and the third conductive layer 128 of the cooling structure 130 at a position along the third conductive layer 128 of the cooling structure 130 at a location apart from the substrate inlet port 112. Non-limiting example power electronics assemblies and integrated fluid channel systems are described in U.S. application Ser. No. 15/218,801 titled "Power Electronics Assemblies Having a Semiconductor Device with Metallized Embedded Cooling Channels," filed on Jul. 25, 2016, and U.S. application Ser. No. 15/175,622 titled "Power Electronics Assemblies Having a Semiconductor Cooling Chip and an Integrated Fluid Channel System," filed on Jun. 7, 2016, and U.S. application Ser. No. 15/175,674 titled "Power Electronics Assemblies having a Wide Bandgap Semiconductor Device and an Integrated Fluid Channel System," filed on Jun. 7, 2016, which are hereby incorporated by reference.

With continue reference to FIG. 2, the example cooling structure 130 further comprises at least one metallized through-substrate via 158a extending through the cooling structure 130. The at least metalized through-substrate via 158a is electrically coupled to the at least one device conductive layer 126 at the first device surface 122 between adjacent semiconductor fluid channels 160. As an example in FIG. 2, there are two metalized through-substrate vias (TSV) 158a, 158b each of which is formed between the plurality of semiconductor fluid channels 160. The metallized through-substrate vias (TSV) 158a, 158b may be used to electrically couple to the conductive layer 128. It should be noted that usage of the metallized through-substrate vias (TSV) 158a, 158b are optional and can be eliminated when a majority or entire of the exterior surface of the cooling structure 130 is metallized.

The substrate layer 110 comprises a substrate inlet port 112 and a substrate outlet port 114. The substrate inlet port 112 and the substrate outlet port 114 may each extend into the one or more substrate sidewalls 119, as seen best in FIG. 2. For example, the substrate inlet port 112 may extend into the first substrate sidewall 119a and the substrate outlet port 114 may extend into the second substrate sidewall 119b. In a non-limiting example, one or both of the substrate inlet port 112 and the substrate outlet port 114 may extend into the base surface 118 of the substrate layer 110. In another, non-limiting example, one or both of the substrate inlet port 112 and the substrate outlet port 114 may extend into the device facing surface 116 of the substrate layer 110.

Referring again to FIGS. 1 and 2, the illustrated substrate layer 110 of the power electronics assembly 100 may comprise any substrate material, for example a high temperature co-fired ceramic (HTCC) material, a low temperature co-fired ceramic (LTCC) material, FR-4, or the like. The substrate layer 110 may comprise a high temperature substrate layer such as HTCC, that is compositionally configured to withstand a temperature greater than or equal to about an operating temperature of the semiconductor device 120 without substantially deforming or otherwise deteriorating, for example, temperatures greater than about 250° C., 280° C., 300° C., 320° C., 350° C., or the like. As depicted in FIG. 1, the substrate layer 110 comprises a device facing surface 116 opposite a base surface 118. Further, the substrate layer 110 comprises one or more substrate sidewalls 119 extending around a perimeter of the substrate layer 110 between the device facing surface 116 and the base surface 118.

As depicted in FIGS. 1 and 2, the power electronics assembly 100 may further comprise one or more busbars electrically coupled to the semiconductor device 120. The one or more busbars may include a power busbar 190 electrically coupled to the semiconductor device 120, for example, electrically coupled to the second device conductive layer 127 using a first electrical wire 191. The one or more busbars may also include a signal busbar 192 electrically coupled to the semiconductor device 120, for example, electrically coupled to the second device conductive layer 127 using a second electrical wire 193. While the power busbar 190 and the signal busbar 192 are depicted in electrical engagement with the second device conductive layer 127, it should be understood that the power busbar 190 and the signal busbar 192 may be electrically coupled to any component of the semiconductor device 120.

In operation, the power busbar 190 may output a power signal receivable by the semiconductor device 120 to power the semiconductor device 120. Further, the signal busbar 192 may output a control signal receivable by the semiconductor device 120 to control the operation of the semiconductor device 120, for example, the switching operation of the semiconductor device 120. In some embodiments, the power busbar 190 and the signal busbar 192 may each comprise through-silicon vias configured to connect multiple semiconductor devices 120.

Referring again to FIG. 1, the power electronics assembly 100 may further comprise a cooling fluid reservoir 180, a fluid pump 182, and a secondary heat exchanger 186, each fluidly coupled to the substrate inlet port 112 and the substrate outlet port 114. For example, a coolant pipe system 184 may extend between and fluidly couple the substrate inlet port 112 and the substrate outlet port 114 with each of the cooling fluid reservoir 180, the fluid pump 182, and the secondary heat exchanger 186, and also fluidly couple the cooling fluid reservoir 180 with both the fluid pump 182 and the secondary heat exchanger 186. The cooling fluid reservoir 180 may house the dielectric cooling fluid. Further, the fluid pump 182 may pump the dielectric coolant fluid through the integrated fluid channel system 150. For example, the fluid pump 182 may pump the dielectric coolant fluid from the cooling fluid reservoir 180 and the substrate inlet port 112 through the integrated fluid channel system 150 and from the substrate outlet port 114 to the secondary heat exchanger 186 and the cooling fluid reservoir 180. In operation, the secondary heat exchanger 186 may remove heat collected by the dielectric cooling fluid before the dielectric cooling fluid enters the cooling fluid reservoir 180.

In operation, cooling fluid may be introduced into the substrate inlet port 112, for example, dielectric cooling fluid pumped from the cooling fluid reservoir 180 into the substrate inlet port 112 using the fluid pump 182. The dielectric cooling fluid may flow from the substrate inlet port 112 through the substrate fluid inlet channel 151 and into one or more cooling channels of the semiconductor device 120 and the cooling structure 130, for example, the fluid inlet 152 and the one or more semiconductor fluid channels 160, which each provide a fluid pathway such that coolant fluid flowing therethrough may remove heat from the semiconductor device 120 and the cooling structure 130, for example, heat generated by the semiconductor device 120. Next, the dielectric cooling fluid may flow from the one or more cooling channels positioned in the semiconductor device 120 and the cooling structure 130 into the substrate fluid outlet channel 153 and exit the substrate outlet port 114.

Referring again to FIGS. 1 and 2, a method of manufacturing the power electronics assembly 100 is described. While the method is described below in a particular order, it should be understood that other orders are contemplated. In embodiments comprising the one or more semiconductor fluid channels 160, the method may first comprise etching the one or more semiconductor fluid channels 160 into the semiconductor device 120, for example, using any known or yet to be developed methods of etching semiconductor materials, such as dry etching, wet etching, or the like. Next, the method comprises disposing the fluid channel metallization layer 170 onto the inner surface 162 of the one or more semiconductor fluid channels 160.

The method of manufacturing the power electronics assembly 100 may next comprise coupling or otherwise positioning the first device surface 122 of the semiconductor device 120 onto the first conductive layer 130 and the second device surface 124 of the semiconductor device 120 onto the second conductive layer 127. Next, in embodiments comprising the cooling structure 130, the method may first comprise etching the fluid inlet 152, fluid outlet 154, and the manifold channel 156 into the cooling structure 130, for example, using any known or yet to be developed methods of etching cooling structure materials, such as dry etching, wet etching, or the like. Then, the side electrodes 138a, 138b are bonded to the respective side surfaces 136a, 136b by any known or yet to be developed processes such as, without limitation, by electroplating, physical vapor deposition, chemical vapor deposition, laser metal deposition, or any other known or yet to be developed deposition process. Finally, the cooling structure 130 is coupled to the semiconductor 120 by any known or yet to be developed processes such as, without limitation, by adhering, sintering, brazing, solder bonding, direct bonding, diffusion bonding, transient liquid phase bonding (TLP), or any other known or yet to be developed bonding processes.

Figure 3:
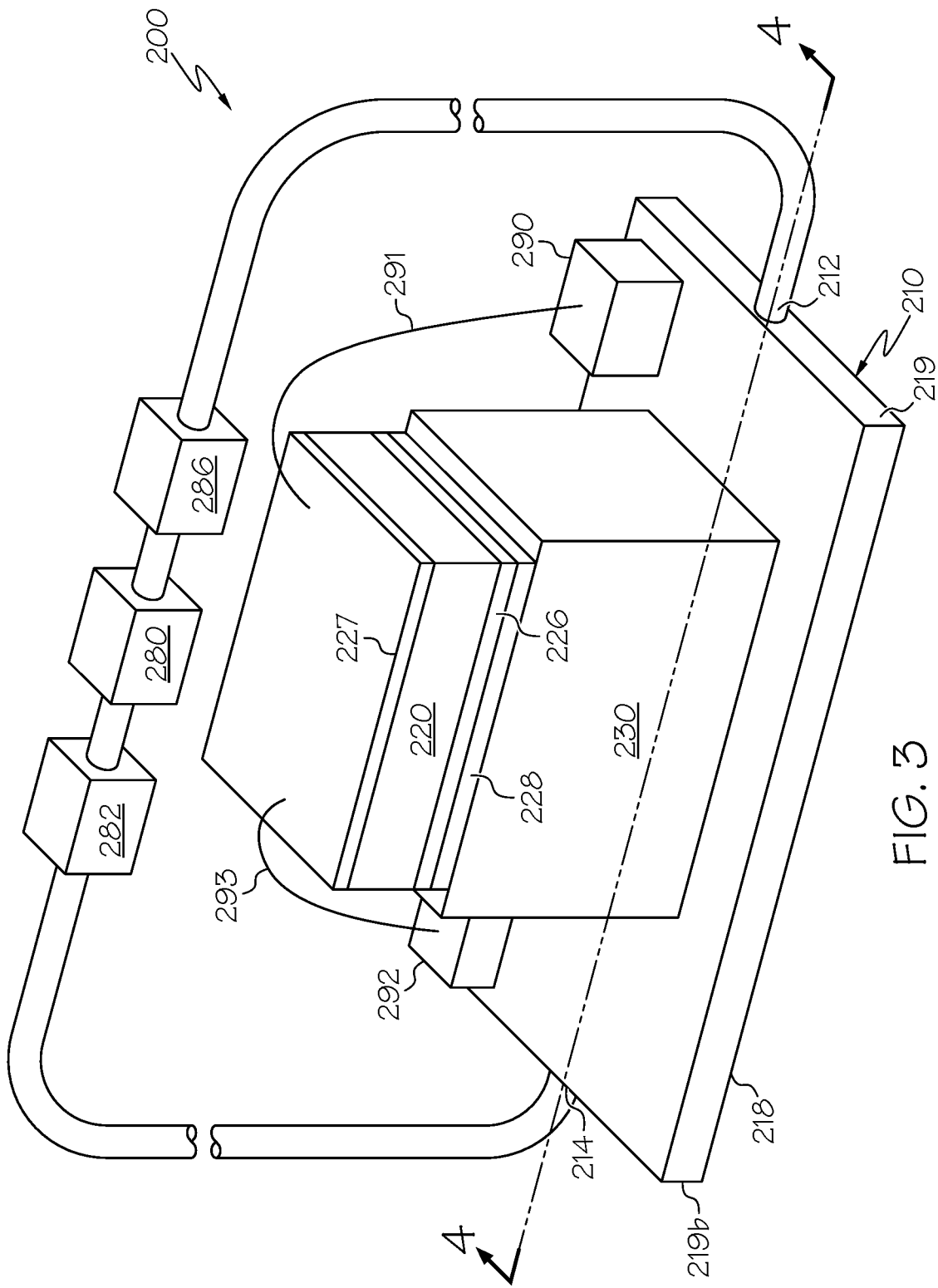
FIG. 3 schematically depicts a top perspective view of an alternative example power electronics assembly having a semiconductor device and another cooling structure, according to one or more embodiments shown and described herein.
Figure 4:
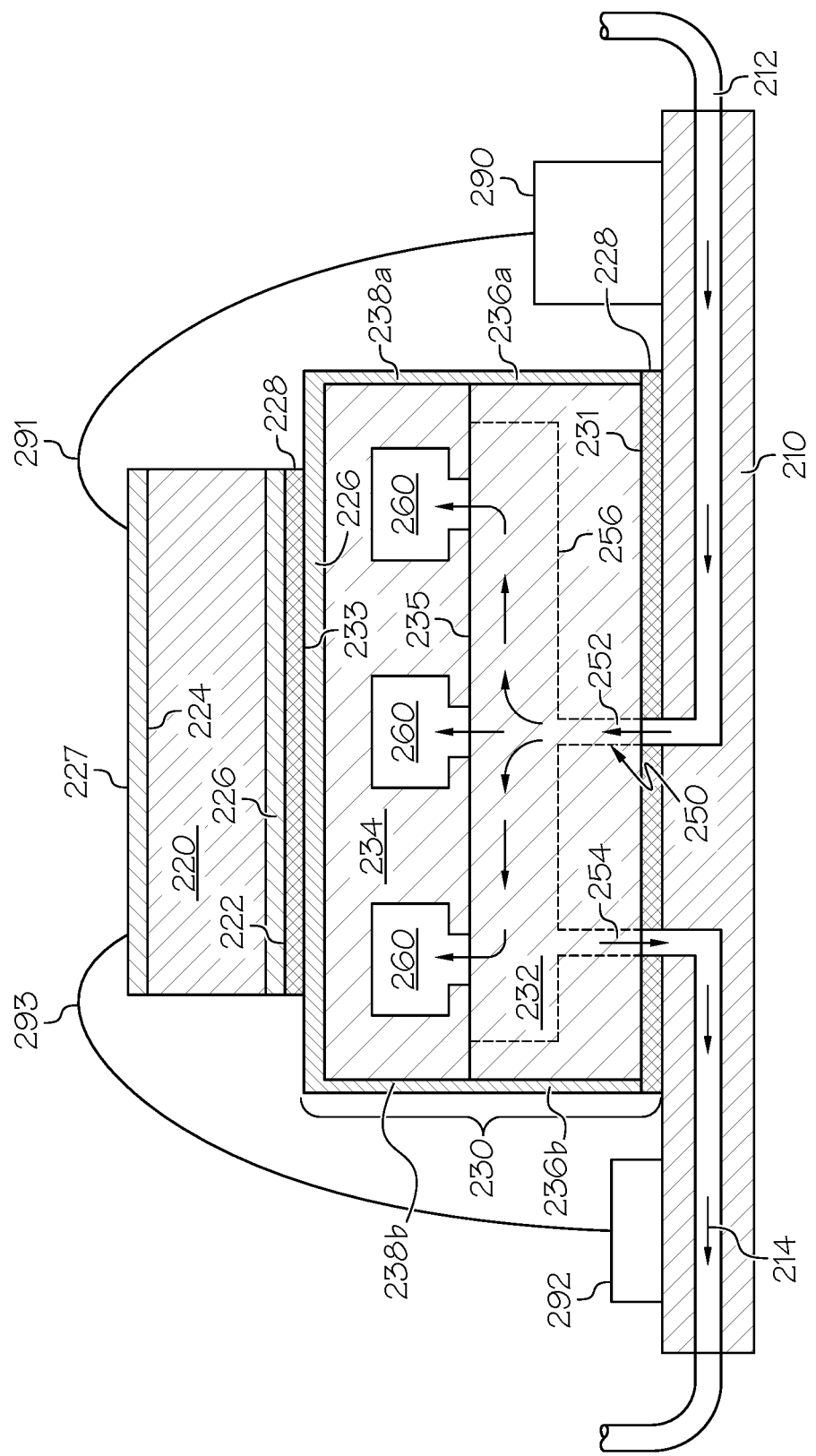
FIG. 4 schematically depicts a cross section of the alternative example power electronics assembly of FIG. 3 with the cooling structure defined by a manifold layer and a microchannel layer according to one or more embodiments shown and described herein.

Referring now to FIGS. 3 and 4, another embodiment of an example electronics assembly 200 is depicted. Specifically, FIG. 3 depicts a top perspective view of an example electronics assembly 200 having a semiconductor device 220, a cooling structure 230, and a substrate layer 210 and FIG. 4 depicts a cross section of the example electronics assembly 200 of FIG. 3 with the cooling structure 230 defined by a manifold layer 232 and a microchannel layer 234. The semiconductor device 220 includes a first device surface 222 and a second device surface 224. In one embodiment, at least one device conductive layer 226 is disposed on the first device surface 222. In the alternative embodiment, both of the first device surface 222 and the second device surface 224 may be covered by the first device conductive layer 226 and the second device conductive layer 227, respectively. The semiconductor device 220 is configured to have a vertical electrical current pathway extending through the semiconductor device 220 between the first device surface 222 and the second device surface 224.

The cooling structure 230 is coupled to the semiconductor device 220 by a solder layer 228. The solder layer 228 is electrically conductive and provides the thermal interface between the semiconductor device 220 and the cooling structure 230. The cooling structure 230 is defined by a manifold layer 232 and a microchannel layer 234 that is bonded to the manifold layer 232. The manifold layer 232 may be bonded to the microchannel layer 234 by any known or yet to be developed method. The manifold layer 232 and the microchannel layer 234 may be made from silicon materials. Alternatively, the cooling structure 230 may be one single wafer that is etched so that the manifold layer 232 and the microchannel layer 234 are constructed integrally from the one single wafer and therefore, the bonding step of the manifold layer 232 and the microchannel layer 234 to one another is not required. The manifold layer 232 includes a first cooling structure surface 231 and a fluid inlet 252 and a fluid outlet 254 that are fluidly coupled to microchannels 260 of the microchannel layer 234. Coolant fluid flows through the fluid inlet 252, the microchannels 260, and the fluid outlet 254 to cool the semiconductor device 220 during operation. Similar to the example cooling structure 130, the exterior surfaces, such as respective first and second side surfaces 236a, 236b of the cooling structure 230 are at least partially plated with metal to form one or more side electrode 238 that provide an electrical path for current around a perimeter of the cooling structure 230. The second cooling structure surface 232 of the cooling structure 230 is electrically coupled to the electrically conductive layer 226 of the semiconductor device 220.

Referring still to FIGS. 3 and 4, as noted above, both of the first device surface 222 and the second device surface 224 may be covered by the first device conductive layer 226 and the second device conductive layer 227, respectively. The semiconductor device 220 comprises a semiconductor material such as those described hereinbefore.

Referring again to FIGS. 3 and 4, the side electrodes 238a and the second side electrode 238b are each coupled to the semiconductor device 220. Further, the first side electrode 238a and the second side electrode 238b are each electrically coupled to the semiconductor device 220 such that an electrical current pathway is formed between the first side electrode 238a and the second side electrode 238b, extending through the semiconductor device 220, for example, a vertical electrical current pathway. In other embodiments, the first side electrode 238a comprises a source electrode and the second side electrode 238b comprises a drain electrode such that, in operation, electrical current flows from the first side electrode 238a to the second side electrode 238b. The first and second electrodes 238a, 238b may comprise any electrically conductive material such as, without limitation, copper, copper oxide, graphite, brass, silver, platinum, or the like.

In some embodiments, the respective first side electrode 238a and the second side electrode 238b may comprise a discrete metal layer that is bonded to the respective first side surface 236a and the second side surface 236b of the cooling structure 230 and in other embodiments the respective first side electrode 238a and the second side electrode 238b may comprise a metallization layer that is deposited onto the respective first side surface 236a and the second side surface 236b using any known or yet to be developed deposition process, for example, electroplating, physical vapor deposition, chemical vapor deposition, laser metal deposition, or any other known or yet to be developed deposition process. In some embodiments, in addition to the first side electrode 238a and second side electrode 238b, a majority of the exterior surface of the cooling structure 230 can be metallized with a metal to provide an electrical path for current around a perimeter of the cooling structure 130. Alternatively, the entire exterior surface such as top, bottom, and the sides of the cooling structure 130 can be metalized plated with a metal layer to provide an electrical path for current around a perimeter of the cooling structure 130.

As illustrated in FIG. 4, the power electronics assembly 200 includes an integrated fluid channel system 250 extending within the manifold layer 232 and the microchannel layer 234. The integrated fluid channel system 250 provides a fluid flowpath extending within the manifold layer 232 such that a dielectric cooling fluid may be circulated through the substrate layer 210 and cooling structure 230 to remove heat from one or more semiconductor devices 220 of the power electronics assembly 200. Example, non-limiting dielectric cooling fluids include R-245fa and HFE-7100. Other dielectric cooling fluids may be utilized. The manifold layer 232 includes the fluid inlet 252 for receiving the dielectric cooling fluid and the fluid outlet 254 for removing the dielectric cooling fluid from the cooling structure 230. The coolant fluid from the substrate layer 210 is directed into the manifold layer 232 via the fluid inlet 252 and enters into a manifold channel 256. The manifold channel 256 is fluidly coupled to the at least one semiconductor fluid microchannel 260. Cooling fluid flows out of the manifold channel 156 and into the respective microchannel 260 of the microchannels layer 234. After the coolant fluid is circulated to remove heat from the semiconductor 220, the coolant fluid is discharged from the manifold layer 230 via fluid outlet 254. In a non-limiting example, the fluid inlet 252 and the fluid outlet 254 may be formed into the side surfaces 236a, 236b of the cooling structure 230 and direct the flow path into the manifold channel 256 without using the substrate layer 210.

Referring still to FIG. 4, as noted hereinbefore, the microchannels layer 234 includes a second cooling structure surface 233 and at least one microchannel 260 at a bonding surface 235. The at least one semiconductor fluid microchannels 260 includes a plurality of the fluid microchannels 260. As an example in FIG. 4, there is shown three fluid microchannels 260, however, any number of microchannels 260 (e.g., >200) can be used depending on the size and shape of the microchannels layer 234. The microchannels 260 may be generally rectangularly-shaped straight channels. However, one of ordinary skill in the art would appreciate that the microchannels 260 may have a jet impingement structure that causes jets of cooling fluid to impinge small unit cells of microchannels to remove heat promptly and to provide better temperature uniformity and lower pressure drop. Non-limiting example power electronics assemblies, microchannel layer, microchannels, and the jet impingement structure such as shown in U.S. Pat. No. 8,659,896, the disclosure of which is incorporated in full herein by reference in its entirety.

Referring again to FIGS. 3 and 4, the illustrated substrate layer 210 of the power electronics assembly 200 may comprise any substrate material, for example a HTCC material or LTCC material, FR-4, or the like. The substrate layer 210 may comprise a high temperature substrate layer such as HTCC, that is compositionally configured to withstand a temperature greater than or equal to about an operating temperature of the semiconductor device 220 without substantially deforming or otherwise deteriorating, for example, temperatures greater than about 250° C., 280° C., 300° C., 320° C., 350° C., or the like. As depicted in FIG. 3, the substrate layer 210 comprises a device facing surface 216 opposite a base surface 218. Further, the substrate layer 210 comprises one or more substrate sidewalls 219 extending around a perimeter of the substrate layer 210 between the device facing surface 216 and the base surface 218.

The substrate layer 210 comprises a substrate inlet port 212 and a substrate outlet port 214. The substrate inlet port 212 and the substrate outlet port 214 may each extend into the one or more substrate sidewalls 219, as shown in FIG. 4. For example, the substrate inlet port 212 may extend into the first substrate sidewall 219a and the substrate outlet port 214 may extend into the second substrate sidewall 219b. Moreover, one or more fluid couplings may be provided at the substrate inlet port 212 and the substrate outlet port 214 in some embodiments. In a non-limiting example, one or both of the substrate inlet port 212 and the substrate outlet port 214 may extend into the base surface 218 of the substrate layer 210. In another, non-limiting example, one or both of the substrate inlet port 212 and the substrate outlet port 214 may extend into the device facing surface 216 of the substrate layer 210.

As depicted in FIGS. 3 and 4, the electronics assembly 200 may further comprise one or more busbars electrically coupled to the semiconductor device 220. The one or more busbars may include a power busbar 290 electrically coupled to the semiconductor device 220, for example, electrically coupled to the second device conductive layer 227 using a first electrical wire 291. The one or more busbars may also include a signal busbar 292 electrically coupled to the semiconductor device 220, for example, electrically coupled to the second device conductive layer 227 using a second electrical wire 293. While the power busbar 290 and the signal busbar 292 are depicted in electrical engagement with the second device conductive layer 227, it should be understood that the power busbar 290 and the signal busbar 292 may be electrically coupled to any component of the semiconductor device 220.

In operation, the power busbar 290 may output a power signal receivable by the semiconductor device 220 to power the semiconductor device 220. Further, the signal busbar 292 may output a control signal receivable by the semiconductor device 220 to control the operation of the semiconductor device 220, e.g., the switching operation of the semiconductor device 220. In some embodiments, the power busbar 290 and the signal busbar 292 may each comprise through-silicon via configured to connect multiple semiconductor devices 220.

Referring again to FIG. 3, the power electronics assembly 200 may further comprise a cooling fluid reservoir 280, a fluid pump 282, and a secondary heat exchanger 286, each fluidly coupled to the substrate inlet port 212 and the substrate outlet port 214. For example, a coolant pipe system 284 may extend between and fluidly couple the substrate inlet port 212 and the substrate outlet port 214 with each of the cooling fluid reservoir 280, the fluid pump 282, and the secondary heat exchanger 286, and also fluidly couple the cooling fluid reservoir 280 with both the fluid pump 282 and the secondary heat exchanger 286. The cooling fluid reservoir 280 may house dielectric cooling fluid. Further, the fluid pump 282 may pump the dielectric coolant fluid through the integrated fluid channel system 250. For example, the fluid pump 282 may pump the dielectric coolant fluid from the cooling fluid reservoir 280 and the substrate inlet port 212 through the integrated fluid channel system 250 and from the substrate outlet port 214 to the secondary heat exchanger 286 and the cooling fluid reservoir 280. In operation, the secondary heat exchanger 286 may remove heat collected by the dielectric cooling fluid before the dielectric cooling fluid enters the cooling fluid reservoir 280.

In operation, cooling fluid may be introduced into the substrate inlet port 212, for example, dielectric cooling fluid pumped from the cooling fluid reservoir 280 into the substrate inlet port 212 using the fluid pump 282. The dielectric cooling fluid may flow from the substrate inlet port 212 through the substrate fluid inlet channel 252 and into one or more cooling channels of the semiconductor device 220 and the cooling structure 230, for example, the electrode fluid channels 256 and the one or more semiconductor fluid channels 260, which each provide a fluid pathway such that coolant fluid flowing therethrough may remove heat from the semiconductor device 220 and the cooling structure 230, for example, heat generated by the semiconductor device 220. Next, the dielectric cooling fluid may flow from the one or more cooling channels positioned in the semiconductor device 220 and the cooling structure 230 into the substrate fluid outlet channel 254 and exit the substrate outlet port 214.

Referring again to FIGS. 3 and 4, a method of manufacturing the power electronics assembly 200 is described. While the method is described below in a particular order, it should be understood that other orders are contemplated. In embodiments comprising the manifold layer 232, the method may first comprise etching the fluid inlet 252, the fluid outlet 254, and the manifold channel 256 into the manifold layer 232, for example, using any known or yet to be developed methods of etching manifold layer materials, such as dry etching, wet etching, or the like. Next, in embodiments comprising the microchannel layer 234, the method may first comprise etching the one or more microchannels 260 into the microchannel layer 234, for example, using any known or yet to be developed methods of etching microchannel layer materials, such as dry etching, wet etching, or the like. Moreover, the manifold layer 232 and the microchannels layer 234 are bonded to one another to form the cooling structure 230 by using any appropriate bonding process. Next, the exterior surface or perimeter of the cooling structure 230 is partially or fully metallized so as to enhance the electrical connectivity between the cooling structure 230 and the semiconductor 220 as described hereinbefore. Finally, the cooling structure 230 is coupled to the semiconductor 220 by the solder layer 228 as described hereinbefore.

It should now be understood that the embodiments described herein are directed to electronics assemblies that include a substrate layer, a semiconductor device, one or more electrodes electrically coupled to the semiconductor device, and an integrated fluid channel system comprising semiconductor fluid channels extending within at least the semiconductor device. In the present disclosure, the side electrodes provide an additional electrically conductive path between the electrically conductive layer on the bottom of the cooling structure and the top of the cooling structure. Therefore, the top, bottom and sides of the cooling structure may be covered (e.g., plated) with an electrically conductive material. Moreover, in one embodiment, the exterior surfaces of the cooling structure may partially or entirely be plated with metal to provide an electrical path for electrical current around a perimeter of the cooling structure. Furthermore, fluid channel metallization layers may be positioned along inner surfaces of the semiconductor fluid channels. In operation, cooling fluid may be circulated through the integrated fluid channel system to remove heat from the semiconductor device. The semiconductor fluid channels positioned directly within the semiconductor device facilitate heat removal at the heat source, for example, the semiconductor device, lowering the thermal resistance created by intervening structure between the heat source and the dielectric cooling fluid. Moreover, the fluid channel metallization layer may lower the electrical on-resistance of the semiconductor device caused by the semiconductor fluid channels, maintaining or even improving the electrical performance of the semiconductor device while simultaneously improving heat removal from the semiconductor device.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An electronics assembly comprising:
a semiconductor device comprising a first device surface with at least one device conductive layer disposed directly on the first device surface and at least one semiconductor fluid channel extending into the first device surface;
a cooling structure coupled to the semiconductor device, the cooling structure comprising:
a first cooling structure surface and a second cooling structure surface, wherein the second cooling structure surface is opposite from the first cooling structure surface, and the first cooling structure surface is coupled to the semiconductor device;
at least one side cooling structure surface transverse to the first cooling structure surface and the second cooling structure surface;
a fluid inlet for receiving a cooling fluid; and
a fluid outlet for removing the cooling fluid from the cooling structure; and
a metal layer disposed on an exterior side surface of the cooling structure, wherein the metal layer is configured as at least one side electrode for providing an electrical current path around at least a portion of a perimeter of the cooling structure.

2. The electronics assembly of claim 1, wherein the semiconductor device is a wide bandgap semiconductor device having a wide bandgap semiconductor material.

3. The electronics assembly of claim 2, wherein the wide bandgap semiconductor material of the wide bandgap semiconductor device comprises at least one of SiC, GaN, AlN, BN and diamond.

4. The electronics assembly of claim 1 wherein, the at least one semiconductor fluid channel includes an inner surface comprising a first wall portion and a second wall portion spaced apart from the first wall portion by a channel width, wherein the at least one device conductive layer is disposed directly on the inner surface of the at least one semiconductor fluid channel.

5. The electronics assembly of claim 4, wherein the at least one semiconductor fluid channel extends from the first device surface of the semiconductor device to a termination location located within a bulk of the semiconductor device and wherein the at least one semiconductor fluid channel includes straight channels having a uniform cross sectional shape along the first device surface of the semiconductor device.

6. The electronics assembly of claim 4, wherein:
the at least one semiconductor fluid channel comprises a plurality of semiconductor fluid channels,
the cooling structure comprises at least one metalized through-substrate via extending through the cooling structure, and
the metalized through-substrate via is electrically coupled to the at least one device conductive layer at the first device surface between the plurality of semiconductor fluid channels.

7. The electronics assembly of claim 4, further comprising:
a second device surface opposite from the first device surface, wherein the semiconductor device is configured to have a vertical electrical current pathway extending through the semiconductor device between the first device surface and the second device surface.

8. The electronics assembly of claim 1, wherein:
one or more cooling structure conductive layers are disposed on the first cooling structure surface, the second cooling structure surface, and the at least one side cooling structure surface, and
the at least one side electrode is defined by the one or more cooling structure conductive layers disposed on the at least one side cooling structure surface.

9. The electronics assembly of claim 8, wherein the one or more cooling structure conductive layers covers a majority of an exterior surface of the cooling structure.

10. The electronics assembly of claim 1, wherein the cooling structure is below the at least one semiconductor fluid channel.

11. An electronics assembly comprising:
a semiconductor device comprising:
a first device surface and a second device surface opposite from the first device surface,
at least one device conductive layer disposed directly on the first device surface, and
at least one semiconductor fluid channel extending into the first device surface, the at least one semiconductor fluid channel having an inner surface having a first wall portion and a second wall portion spaced apart from the first wall portion by a channel width, wherein the at least one device conductive layer is disposed on the inner surface of the at least one semiconductor fluid channel; and
a cooling structure comprising:
a first cooling structure surface and a second cooling structure surface opposite from the first cooling structure surface, wherein the first cooling structure surface is coupled to the semiconductor device;
at least one side cooling structure surface transverse to the opposed respective first and second opposed cooling structure;
at least one side electrode disposed on the at least one side cooling structure surface, wherein the at least one side electrode is electrically coupled to the at least one device conductive layer;
at least one metalized through-substrate via configured to extend through the cooling structure;
a fluid inlet for receiving a cooling fluid;
a fluid outlet for removing the cooling fluid from the cooling structure; and at least one microchannel fluidly coupled to the fluid inlet, the fluid outlet, and the at least one semiconductor fluid channel.

12. The electronics assembly of claim 11, wherein the at least one semiconductor fluid channel comprises a plurality of semiconductor fluid channels.

13. The electronics assembly of claim 12, wherein the at least one metalized through-substrate via is electrically coupled to the at least one device conductive layer at the first device surface between the plurality of semiconductor fluid channels.

14. The electronics assembly of claim 11, wherein the cooling structure is below the at least one semiconductor fluid channel.

* * * * *